United States Patent
Wang et al.

(10) Patent No.: US 12,272,563 B2
(45) Date of Patent: Apr. 8, 2025

(54) METAL OXIDE DIRECTIONAL REMOVAL

(71) Applicant: Applied Materials, Inc., Santa Clara, CA (US)

(72) Inventors: Baiwei Wang, Milpitas, CA (US); Rohan Puligoru Reddy, San Jose, CA (US); Xiaolin C. Chen, San Ramon, CA (US); Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 142 days.

(21) Appl. No.: 17/376,337

(22) Filed: Jul. 15, 2021

(65) Prior Publication Data

US 2023/0015080 A1    Jan. 19, 2023

(51) Int. Cl.
  *H01L 21/311*  (2006.01)
  *H01J 37/32*  (2006.01)

(52) U.S. Cl.
  CPC .. *H01L 21/31122* (2013.01); *H01J 37/32449* (2013.01); *H01J 2237/334* (2013.01); *H01J 2237/338* (2013.01)

(58) Field of Classification Search
  CPC ......... H01L 21/31116; H01L 21/32136; H01L 21/32135
  See application file for complete search history.

(56) References Cited

U.S. PATENT DOCUMENTS

| | | | | |
|---|---|---|---|---|
| 5,786,276 A | * | 7/1998 | Brooks | H01L 21/31116 438/719 |
| 10,184,173 B1 | * | 1/2019 | Yonemoto | C23C 16/50 |
| 11,062,921 B1 | * | 7/2021 | Cui | H01L 21/32136 |
| 2007/0251939 A1 | * | 11/2007 | Minkovich | H01L 21/67225 219/505 |
| 2012/0091095 A1 | * | 4/2012 | Wang | H01J 37/32862 216/37 |
| 2015/0214474 A1 | * | 7/2015 | Nishimura | C21D 8/12 438/3 |
| 2018/0033635 A1 | | 2/2018 | Kanarik et al. | |

(Continued)

FOREIGN PATENT DOCUMENTS

| | | |
|---|---|---|
| WO | 2018-157090 A1 | 8/2018 |
| WO | 2020-150043 A1 | 7/2020 |

OTHER PUBLICATIONS

International Search Report and Written Opinion mailed on Oct. 13, 2022 in International Patent Application No. PCT/US2022/033846, 10 pages.

*Primary Examiner* — Thomas T Pham
(74) *Attorney, Agent, or Firm* — Kilpatrick Townsend & Stockton LLP

(57) ABSTRACT

Exemplary etching methods may include modifying an exposed surface of a layer of metal oxide on a substrate housed in a processing region of a semiconductor processing chamber to produce a modified portion of metal oxide. The methods may include contacting the modified portion of metal oxide with a fluorine-containing precursor. The contacting may produce a metal oxy-fluoride material. The methods may include flowing an etchant precursor into the processing region. The methods may include contacting the metal oxy-fluoride material with the etchant precursor. The methods may include removing the metal oxy-fluoride material.

9 Claims, 6 Drawing Sheets

(56) References Cited

U.S. PATENT DOCUMENTS

| | | | |
|---|---|---|---|
| 2018/0182597 A1* | 6/2018 | Blomberg | C23F 1/12 |
| 2018/0223437 A1* | 8/2018 | George | C23F 4/00 |
| 2019/0122865 A1* | 4/2019 | Chen | H01J 37/32422 |
| 2020/0294777 A1* | 9/2020 | Hirota | H01L 21/32136 |
| 2021/0175088 A1* | 6/2021 | Dezelah | C23F 4/00 |
| 2021/0335673 A1* | 10/2021 | Huang | H01L 21/823481 |

* cited by examiner

METAL OXIDE DIRECTIONAL REMOVAL

TECHNICAL FIELD

The present technology relates to semiconductor processes and equipment. More specifically, the present technology relates to directionally etching metal-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include modifying an exposed surface of a layer of metal oxide on a substrate housed in a processing region of a semiconductor processing chamber to produce a modified portion of metal oxide. The methods may include contacting the modified portion of metal oxide with a fluorine-containing precursor. The contacting may produce a metal oxy-fluoride material. The methods may include flowing an etchant precursor into the processing region. The methods may include contacting the metal oxy-fluoride material with the etchant precursor. The methods may include removing the metal oxy-fluoride material.

In some embodiments, the etchant precursor may be or include a chlorine-containing precursor. The metal oxide may be or include hafnium oxide. The fluorine-containing precursor may be or include hydrogen fluoride or a plasma enhanced fluorine-containing precursor. The plasma enhanced fluorine-containing precursor may be formed in a remote plasma region of the semiconductor processing chamber. Modifying the exposed surface of the layer of metal oxide may include forming a plasma of an oxygen-containing precursor to produce oxygen-containing plasma effluents. Modifying the exposed surface of the layer of metal oxide may include directing the oxygen-containing plasma effluents to the exposed surface of the layer of metal oxide. The plasma effluents may cause a portion of metal oxide to become amorphous metal oxide. The plasma of the oxygen-containing precursor may be formed in the processing region at a plasma power of greater than or about 100 W. The semiconductor processing chamber may be maintained plasma-free while flowing of the etchant precursor into the processing region. A temperature within the semiconductor processing chamber may be increased prior to contacting the metal oxy-fluoride material with the etchant precursor. A pressure in the semiconductor processing chamber may be maintained below or about 5 Torr while flowing the fluorine-containing precursor. A pressure in the semiconductor processing chamber may be maintained above or about 15 Torr while flowing the etchant precursor into the processing region.

Some embodiments of the present technology may encompass etching methods. The methods may include modifying an exposed surface of a layer of metal-containing material on a substrate housed in a processing region of a semiconductor processing chamber to produce a modified portion of metal-containing material. The methods may include flowing a first halogen-containing precursor into a remote plasma region of the semiconductor processing chamber while striking a plasma to produce plasma effluents. The methods may include contacting the modified portion of metal-containing material with the plasma effluents. The contacting may produce a metal fluoride material. The methods may include flowing a second halogen-containing precursor into the processing region. The methods may include contacting the metal fluoride material with the second halogen-containing precursor. The methods may include removing the metal fluoride material.

In some embodiments, the first halogen-containing precursor may be or include fluorine. The second halogen-containing precursor may be or include boron trichloride, and the metal-containing material may be or include an oxide or nitride including aluminum, hafnium, zirconium, or titanium. The methods may include halting plasma formation prior to flowing the second halogen-containing precursor. Contacting the modified portion of metal-containing material with the plasma effluents may be performed at a first temperature. Contacting the metal fluoride material with the second halogen-containing precursor may be performed at a second temperature greater than the first temperature. The first halogen-containing precursor may be or include nitrogen trifluoride. The methods may include flowing hydrogen with the first halogen-containing precursor. A flow rate of the hydrogen may be at least twice a flow rate of the first halogen-containing precursor. Modifying the exposed surface of the layer of metal-containing material may include forming a plasma of an oxygen-containing precursor to produce oxygen-containing plasma effluents. Modifying the exposed surface of the layer of metal-containing material may include directing the plasma effluents to the exposed surface of the layer of metal-containing material.

Some embodiments of the present technology may encompass etching methods. The methods may include forming a plasma of an oxygen-containing precursor to produce oxygen-containing plasma effluents. The methods may include directing the oxygen-containing plasma effluents to a layer of metal oxide on a substrate housed in a processing region of a semiconductor processing chamber to produce a modified portion of metal oxide. The methods may include flowing a fluorine-containing precursor into a remote plasma region of the semiconductor processing chamber while striking a plasma in the remote plasma region to produce plasma effluents. The methods may include contacting the modified portion of metal oxide with the plasma effluents. The contacting may produce a metal oxy-fluoride material. The methods may include flowing a chlorine-containing precursor into the processing region. The methods may include contacting the metal oxy-fluoride material with the chlorine-containing precursor. The methods may include removing the metal oxy-fluoride material.

Such technology may provide numerous benefits over conventional systems and techniques. For example, the processes may allow a directional dry etching to be performed, which may protect features of the substrate. Additionally, the processes may increase the etch rate of metal-containing films relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
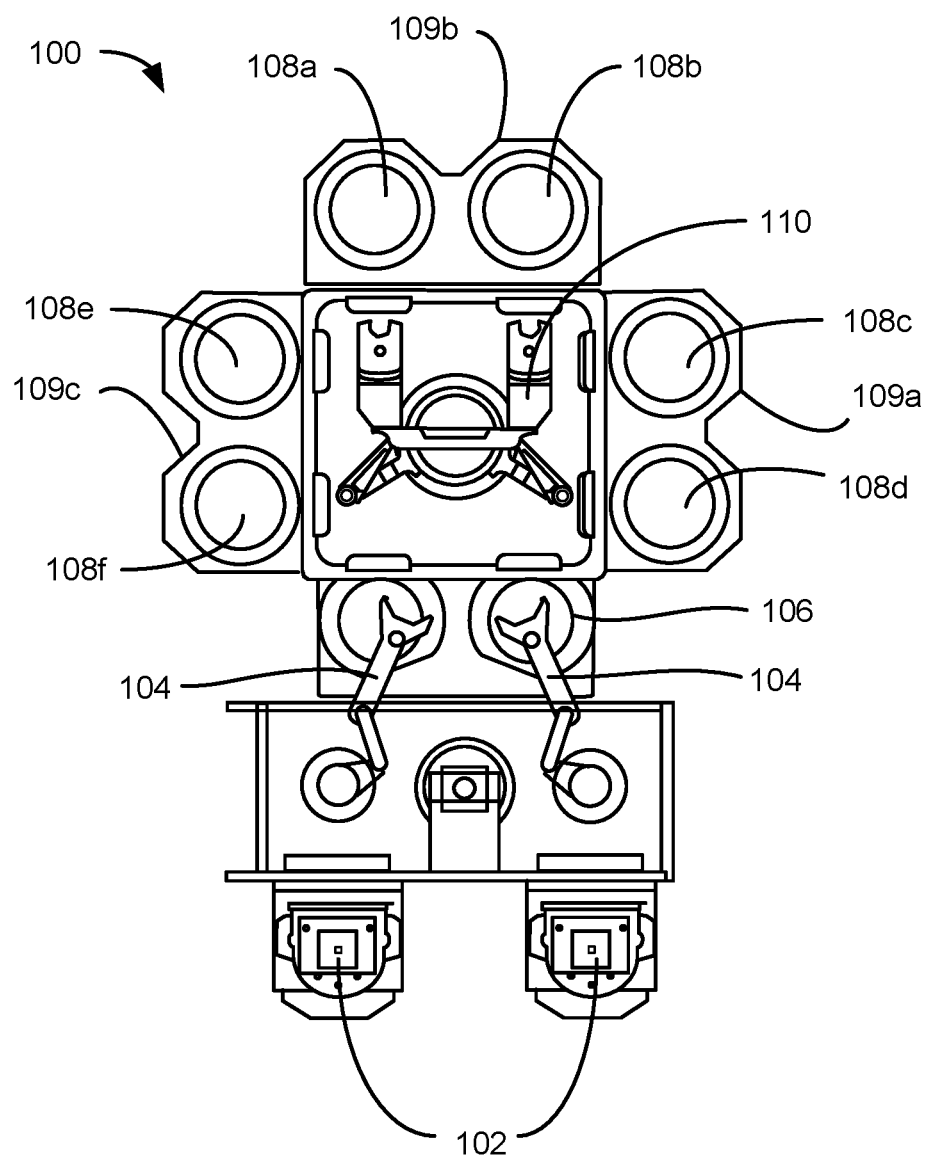
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As scaling for complementary metal-oxide semiconductor materials becomes more challenging, silicon dioxide is often being replaced with high-k dielectric materials. However, many high-k dielectric materials, such as transition-metal oxides or nitrides or other metal oxides or nitrides, may cause implementation challenges. For example, subsequent deposition, one or more removal operations may be performed. Many transition-metal materials may be characterized by more metal-like properties compared to other dielectrics, which may cause removal and etch-back operations to be less selective. Additionally, as device structures become increasingly complex, materials to be removed may be exposed with many additional materials to be maintained during subsequent processing.

Metal oxides are becoming more utilized high-k dielectric materials, which may provide improved transistor performance while maintaining layer thickness. As metal oxide is being incorporated more generally, processing of metal oxide films is beginning to produce layers of material characterized by increased density, which may cause integration challenges. For example, during etch-back or removal operations, denser metal oxide layers, such as layers that have been previously annealed during processing or subsequent to the deposition, may reduce etch selectivity, which may increase damage to surrounding materials on the substrate. Conventional processing of metal oxide may utilize isotropic etch processes, which may cause increased exposure to surrounding materials, and which may reduce selectivity by causing further etching of other materials. The present technology may increase the ability to incorporate dense metal oxide materials by providing a directional removal process that may allow controlled removal of metal oxide from a variety of structures, and which may be selective to a number of materials, which may be masked and/or maintained exposed during the removal.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with the described processes or materials alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
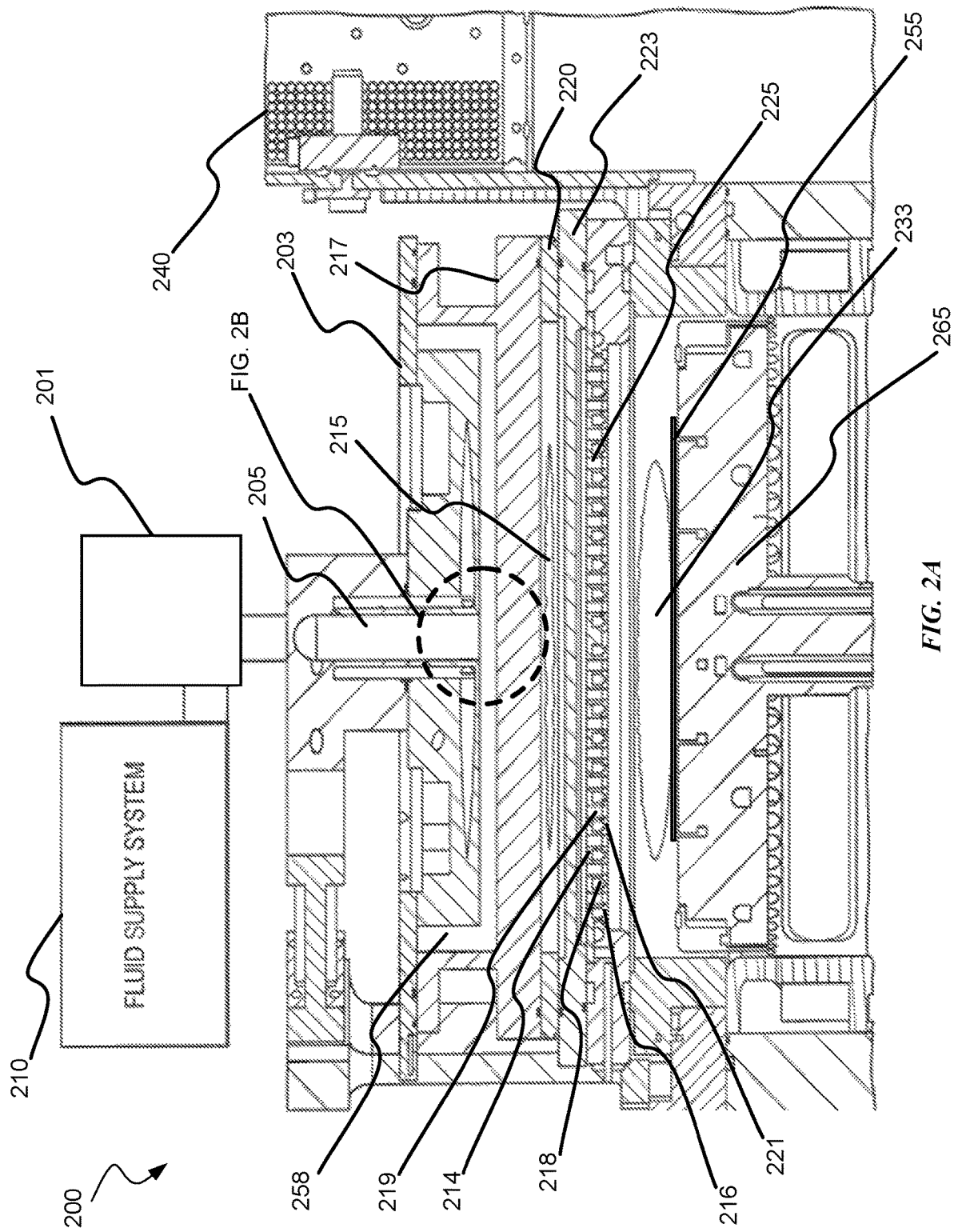
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, metal, silicon, polysilicon, silicon oxide, silicon nitride, silicon oxynitride, silicon oxycarbide, etc., a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively-coupled plasma to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency ("RF") range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
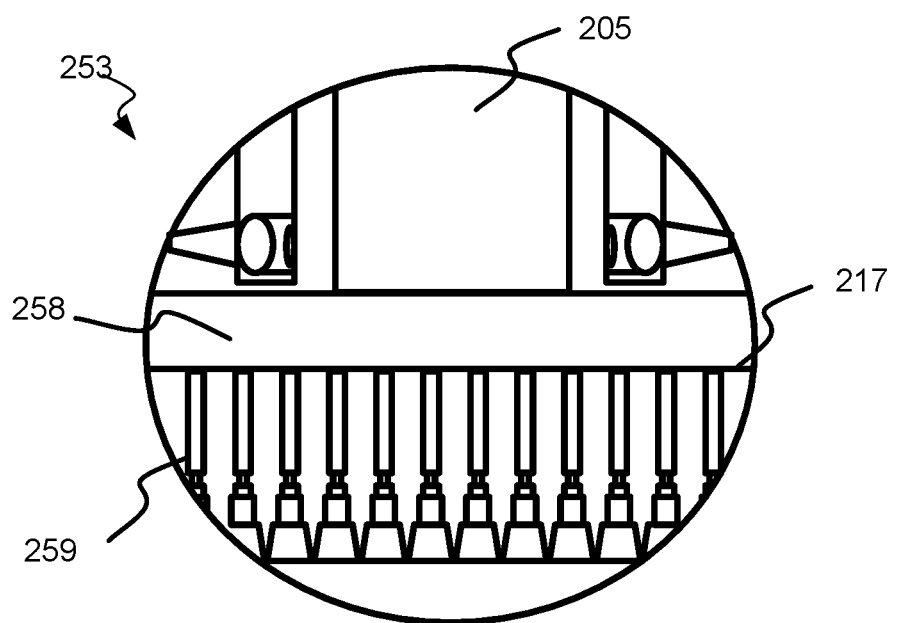
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
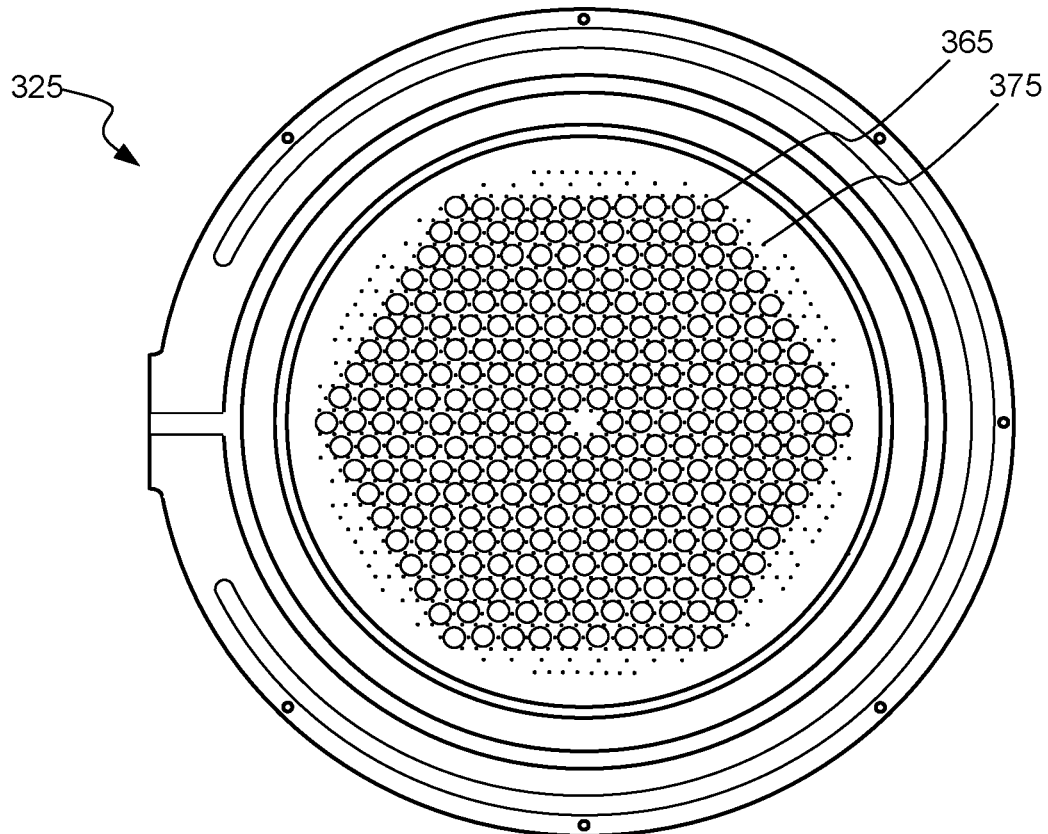
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
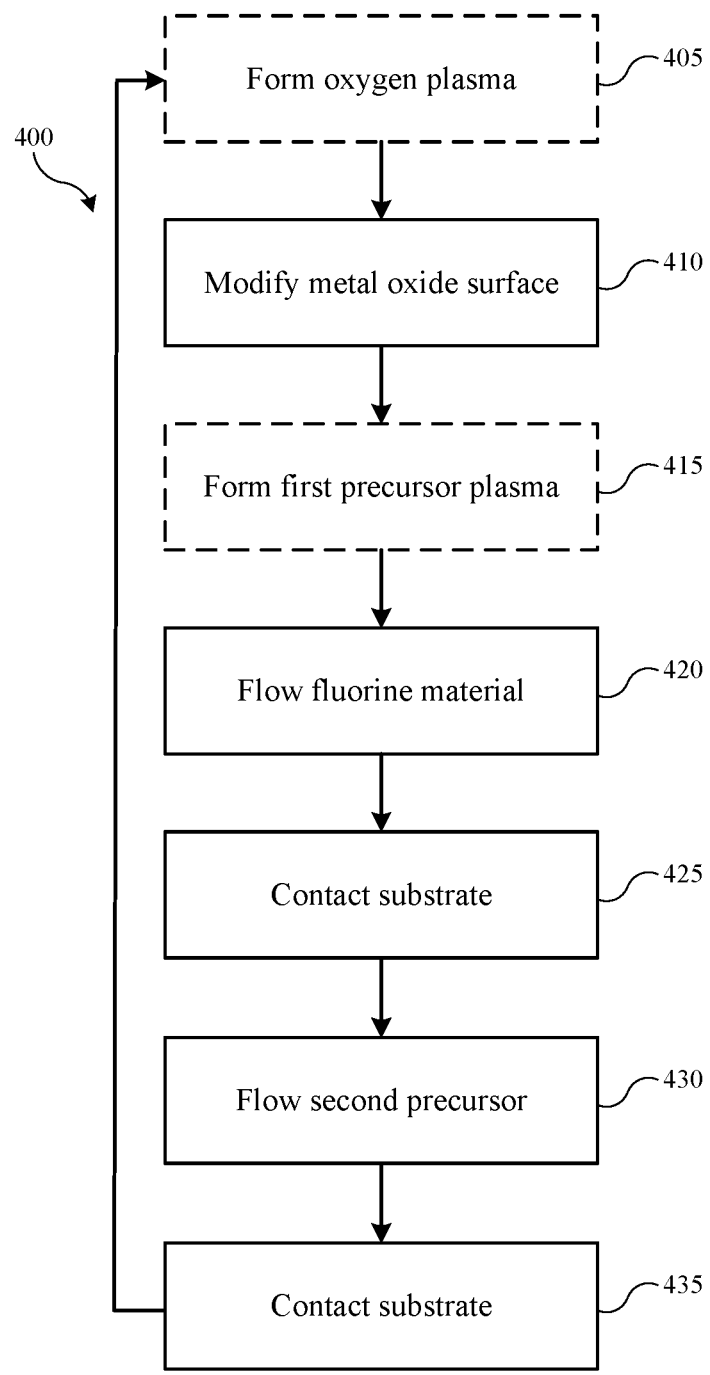
FIG. 4 shows exemplary operations in a method according to some embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 400 may describe operations shown schematically in FIGS. 5A-5D, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
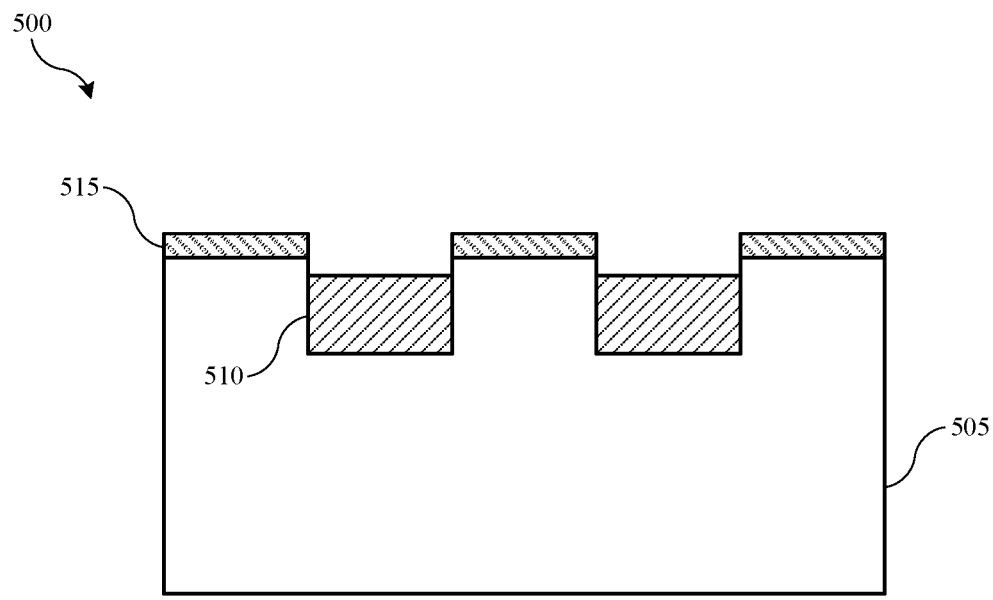
FIGS. 5A-5D show schematic cross-sectional views of materials etched according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which a metal oxide removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials, one or more dielectric materials, a contact material, a transistor material, or any other material that may be used in semiconductor processes.

For example, FIG. 5A may illustrate substrate structures defining one or more trenches or recesses in which a metal oxide 510 material may be disposed. Substrate 505 may illustrate a dielectric material overlying one or more other structures on a substrate, and it is to be understood that any number of materials may be formed beneath the structure illustrated. In some embodiments, dielectric materials may be or include silicon oxide, or any other oxide or nitride through which patterning may occur. Although only two recesses including metal oxide are shown, it is to be understood that any number of recesses and instances may be formed, such as to produce a variety of patterns or structures to be processed. Although the remaining disclosure will reference metal oxide, it is to be understood the present technology may encompass a number of metal oxide and/or nitride films. For example, the metal oxide may include one or more transition metals, such as hafnium, zirconium, titanium, as well as other metals, such as aluminum. The materials may include combination compounds, such as hafnium-zirconium oxide, as well as nitrides of any of these materials. Accordingly, the present technology is not intended to be limited to any specific metal oxide or metal nitride, although the noted compounds may be specifically encompassed by the present technology.

Embodiments of the present technology may involve performing a controlled and anisotropic etch process for removing the metal oxide material, while maintaining the substrate structure about the substrate. Although mask material 515 may be included, conventional isotropic removal of metal oxide may cause undercut in the substrate, which may also be an oxide material, or other dielectric or silicon-containing material. The present technology may limit or prevent isotropic removal by controlling the removal process to remove only modified or damaged material as will be described below. Consequently, the structure etched may be defined by little or more undercut, and exposed materials may be etched specifically in vertical paths that are exposed. In some embodiments encompassed by the present technology, the etch processes may perform recesses that may be essentially or completely anisotropic.

It is to be understood that the noted structure is not intended to be limiting, and any of a variety of other semiconductor structures including metal-containing materials or other metal-containing materials are similarly encompassed. Other exemplary structures may include two-dimensional and three-dimensional structures common in semiconductor manufacturing, and within which a metal-containing material such as metal oxide is to be removed relative to one or more other materials, as the present technology may selectively remove metal-containing materials relative to other exposed materials, such as silicon-containing materials, and any of the other materials discussed elsewhere. Additionally, although a high-aspect-ratio structure may benefit from the present technology, the technology may be equally applicable to lower aspect ratios and any other structures.

Method 400 may be performed to remove an exposed metal-containing material in embodiments, although any number of oxide or metal-containing materials may be removed in any number of structures in embodiments of the present technology. The methods may include specific operations for the removal of metal oxide. Although the remaining disclosure will routinely discuss metal oxide, it is to be understood that other metal oxides may similarly be processed by some embodiments of the present technology. In some embodiments, the methods may include a multiple-operation etch process, which may control etching of the metal oxide relative to other exposed materials, such as a dielectric material, for example silicon oxide, and any underlying materials, which may include dielectric or conductive materials used in the structure.

Method 400 may include forming a plasma within a processing region of a semiconductor processing chamber at optional operation 405. A substrate may already be positioned within the chamber prior to operation 405 as discussed above. With reference to chamber 200 for illustration purposes only, the plasma may be formed or generated in region 233, or within a region defined at least in part by the substrate support pedestal. Such a plasma is similarly understood to be a wafer-level plasma. The effluents of the plasma may be utilized in method 400 for modifying a surface of an exposed material on a semiconductor substrate at operation 410, such as the metal oxide material 510 discussed above. The substrate may be within or housed in the processing region of the semiconductor processing chamber.

Figure 5B:
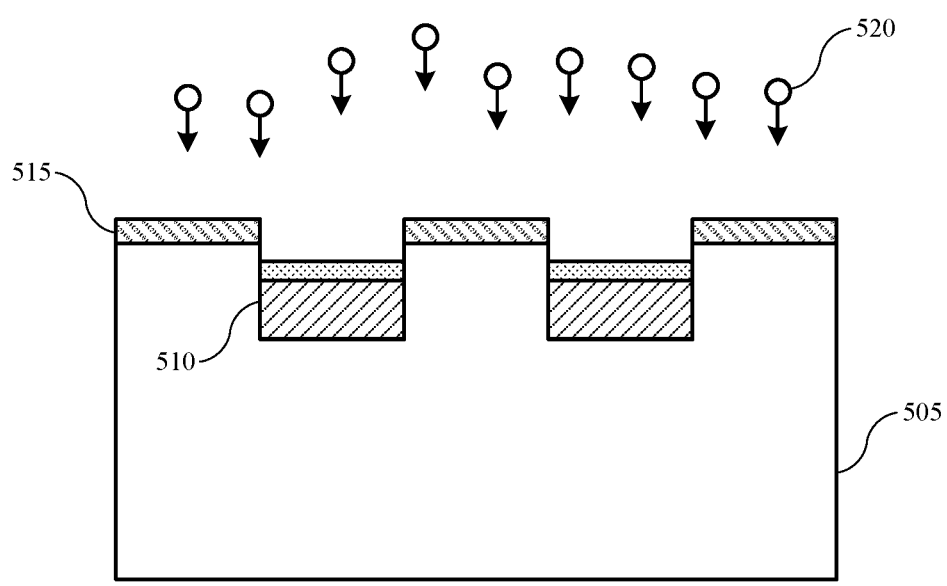

The modifying operations of method 400 may allow a controlled bombardment of the metal oxide, and may cause a metal oxide structure, which may include a previously annealed and denser oxide structure to be amorphized to a certain depth within the structure. The plasma generated may be or include a bias plasma, which may be formed at a power sufficient to bombard the film and break bonds within the structure. Because the modifying operation may be directionally performed, only the mask material 515 and metal oxide material 510 may be contacted by the plasma effluents, as illustrated in FIG. 5B, where oxygen and/or other ions 520 produced in the plasma may be directed in relatively straight paths to the substrate. Consequently, the underlying substrate 505, including sidewalls that may be exposed during subsequent cycles, may be protected during the process operations to remove the metal oxide.

The modifying operation 410 may involve an oxygen-containing gas as well as one or more other gases, which may include diatomic hydrogen, or an inert gas, such as helium, neon, argon, krypton, xenon, or radon. The material used to produce the plasma may also be additional materials or precursors that may have limited chemical activity or be unreactive with the exposed material on the semiconductor surface being modified. By utilizing an oxygen-containing gas, such as diatomic oxygen, nitrous oxide, water, ozone, or other oxygen-containing materials, material bonds may be broken or amorphized within the film to a depth of penetration, which may be controlled based on the bias power. Oxygen radicals may also react with and remove oxygen in the film, which may create a more porous structure during the modifying operations. Along with one or more oxygen-containing materials, additional gases, such as hydrogen and/or helium may be provided, which may affect aspects of the modifying or damaging operation. For example, with hydrogen being a small, light material, it may be less likely to sputter the material at which it is being directed than heavier materials, and may afford deeper penetration within the film. With helium being a heavier material, helium addition may increase bond breakage and release of oxygen in the film. In addition to amorphizing the film, the remaining material may be more porous facilitating volume expansion in subsequent steps. The material may also be more reactive, with more dangling bonds created in the modifying process.

Process conditions may also facilitate the modifying operations. For example, the plasma formed from the oxygen gas may be a bias plasma providing directional flow of plasma effluents to the substrate. The plasma may be a low-level plasma to limit the amount of bombardment, sputtering, and surface modification. In embodiments the plasma power may be less than or about 500 W, and may be less than or about 450 W, less than or about 400 W, less than or about 350 W, less than or about 300 W, less than or about 250 W, less than or about 200 W, or less. By utilizing a plasma power that is, for example, about 300 W or less, the depth of penetration of the plasma effluents may be controlled to limit sidewall interaction or damage of the underlying structure. For example, modification operations as described may allow the surface of the exposed material on the semiconductor substrate to be modified to a depth from the exposed surface within the semiconductor substrate of less than or about 20 nm, and may allow modification of the surface of materials to a depth of less than or about 18 nm, less than or about 16 nm, less than or about 14 nm, less than or about 12 nm, less than or about 10 nm, less than or about 9 nm, less than or about 8 nm, less than or about 7 nm, less than or about 6 nm, less than or about 5 nm, or less.

The modification operation may be relatively or completely insensitive to temperature and in embodiments the temperature may be maintained at any of the temperatures discussed below for plasma operations. The pressure within the processing chamber may be controlled during the modification operation 410 as well. For example, while forming the inert plasma and performing the modification operation, the pressure within the processing chamber may be maintained below or about 1 Torr. Additionally, in some embodiments, the pressure within the processing chamber may be maintained below or about 750 mTorr, below or about 600 mTorr, below or about 500 mTorr, below or about 400 mTorr, below or about 300 mTorr, below or about 250 mTorr, or less. The pressure within the chamber may affect the directionality of the modification operation 410 by affecting the mean-free path of radical materials produced. For example, as pressure is increased, the modification process may become more isotropic due to increased collisions that may cause scattering, and as the pressure is reduced, the modification process may become more anisotropic as the mean-free path increases, allowing improved directionality provided by the bias. Thus, as pressure is increased, underlying materials may begin to be treated as well, which after removal can remove material beyond what was originally desired in certain operations.

After the surface modification of the metal oxide film, a removal process may be performed, which may include a two-part removal. Method 400 may include flowing a halogen-containing precursor, including a first halogen-containing precursor, into the semiconductor processing chamber housing the described substrate. The halogen-containing precursor may be plasma enhanced in some embodiments, such as at optional operation 415. The halogen-containing precursor may be flowed through a remote plasma region of the processing chamber, such as region 215 described above, and a plasma may be formed of the halogen-containing precursor to produce plasma effluents. Although a substrate-level plasma may be produced, in some embodiments the plasma may be a remote plasma, which may protect exposed substrate materials from ion bombardment that may occur due to the substrate-level plasma. When plasma is formed, the plasma power of a capacitively-coupled plasma, or other formed plasma, may be maintained at or below any of the previously noted plasma power levels. Additionally, in some embodiments, the first halogen-containing precursor may not be plasma enhanced, such as by utilizing hydrogen fluoride, which may be flowed directly into the processing region of the chamber.

Figure 5C:
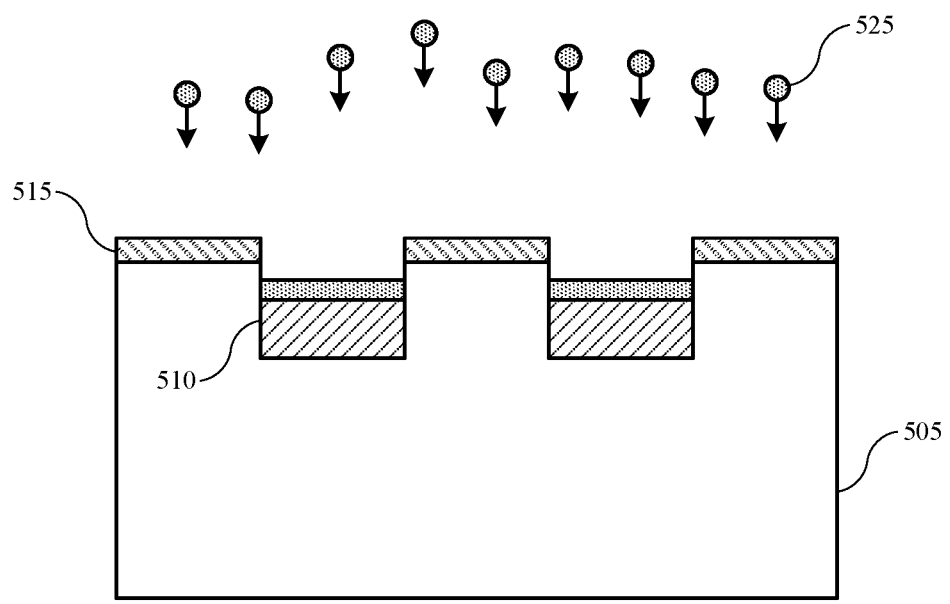

Whether plasma enhanced or not, at operation 420, the plasma effluents of the halogen-containing precursor or the first halogen-containing precursor may be delivered to the substrate processing region, where the effluents may contact the semiconductor substrate including the damaged or amorphized metal-containing material at operation 425, as illustrated in FIG. 5C. Fluorine materials 525, which may be fluorine ions as well as additional ions, such as hydrogen ions as will be noted below, may be flowed to the processing region to interact with the substrate. Because of the porous nature of the amorphized portion of the metal oxide material, fluorine radicals or materials may be incorporated in the porous or damaged structure, and may diffuse through the structure to a level of modification performed. The amorphous structure may more readily receive the fluorine materials, which may cause a volume expansion of the modified portion of the metal oxide material. The contacting may produce a fluorinated material, such as metal oxy-fluoride or a metal oxide halide material, such as by converting the exposed metal oxide on the substrate. In some embodiments, subsequent the fluorination, the plasma may be extinguished, and the chamber may be purged. Because metal oxy-fluoride materials may not be volatile at chamber operating conditions, an additional operation may be performed to cause the amorphized and fluorinated portion to be removed. Additionally, because the fluorination may not penetrate underlying metal oxide, or unmodified portions of the metal oxide, the amount of removal may be limited to the depth of modified material.

Figure 5D:
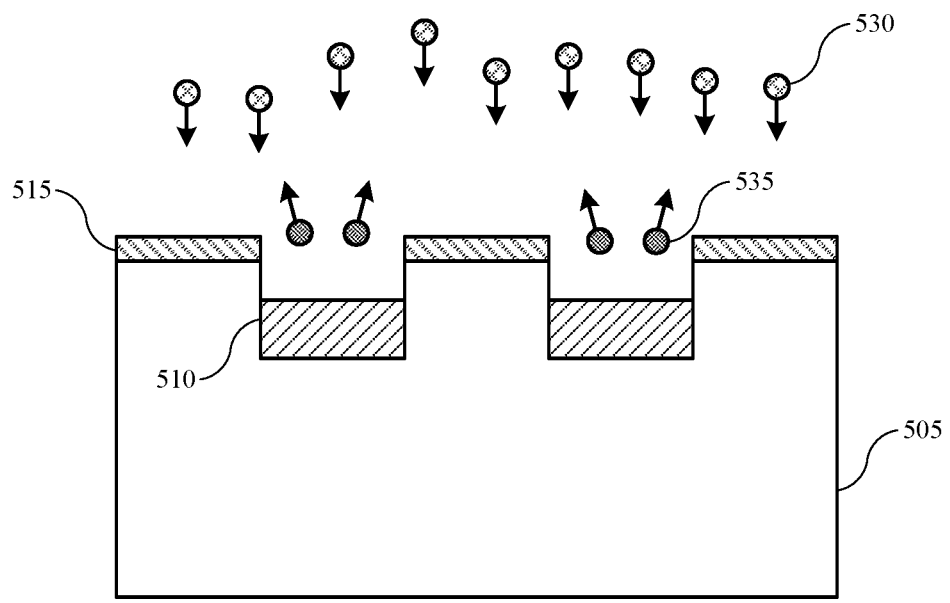

Subsequent the fluorination operation, an etchant precursor may be flowed into the processing region at operation 430. In some embodiments, the etchant precursor may be a second halogen-containing precursor, and may include the same or a different halogen as the first halogen-containing precursor. The etchant precursor may interact with the fluorinated metal oxide or other oxide material to produce metal and/or oxygen byproducts that may be volatile under processing conditions, and may be evolved from the substrate. Accordingly, the etchant precursor may contact the fluorinated material at operation 435, and perform a ligand exchange with the fluorine in the material, and which may produce volatile byproducts that may be released from the substrate. By performing the two removal operations according to embodiments of the present technology, a controlled removal of modified material may be performed, which may maintain underlying materials, as well as substrate materials. As illustrated in FIG. 5D, a second halogen precursor 530 may be delivered, and which may form a ligand exchange with the fluorinated metal oxide. Consequently, metal byproducts 535, which may include metal chloride, metal oxy-chloride, or other materials containing one or more of metal, oxygen, fluorine, hydrogen, and chlorine, may be released from the substrate, which may expose underlying metal oxide, or substrate materials. The method may be repeated any number of cycles to continue removing metal oxide in discreet layers. This may produce a controlled removal based on a depth of modifying, which may allow some or all of a formed metal oxide material to be removed from substrates according to embodiments of the present technology.

Although the second halogen precursor may also be plasma enhanced, in some embodiments the second precursor may not be plasma enhanced, and in some embodiments the semiconductor processing chamber may be maintained plasma-free during delivery and operations utilizing the second halogen precursor. By utilizing particular precursors, and performing the etching within certain process conditions, a plasma-free removal may be performed, and the removal may also be a dry etch. Accordingly, techniques according to aspects of the present technology may be performed to remove metal oxide from any number of features, including high aspect ratio features, and thin dimensions that may otherwise be unsuitable for wet etching or reactive ion etching.

The precursors during each of the two-step removal operation may include halogen-containing precursors, and may include one or more of fluorine or chlorine in some embodiments. Some exemplary precursors that may be utilized as the first precursor may include halides including hydrogen fluoride, nitrogen trifluoride, or any organofluoride. The precursors may also be flowed together in a variety of combinations. In some embodiments, nitrogen trifluoride, or some other fluorine-containing precursor may be delivered to a remote plasma region with hydrogen and plasma enhanced to produce a fluorinated surface of metal oxide in the first operation. Etchant precursors utilized as the second halogen precursor may be or include chlorine-containing precursors, such as including boron trichloride, titanium tetrachloride, or any other chlorine materials. Additionally, in some embodiments, chlorine radical materials may be produced, such as in a plasma process performed locally or remotely, and which may deliver chlorine radical materials to interact with the fluorinated portion of the metal oxide. At processing conditions of the present technology, these chlorine-containing materials may facilitate formation of volatile byproducts that may remove the fluorinated metal oxide. For example, some byproducts may include metal oxychloride or metal chloride, which may be volatile at processing conditions, facilitating removal of the material from the substrate.

Processing conditions may impact and facilitate etching according to the present technology. Because the etch reaction may proceed based on thermal dissociation of halogen for the second reaction between the second halogen precursor and the fluorinated oxide material, the temperatures may be at least partially dependent on the particular halogen or the precursor in order to initiate dissociation. For example, as temperature increases above or about 100° C. or above or about 150° C., etching may begin to occur or increase, which may indicate dissociation of the precursor, and/or activation of the reaction with metal oxy-fluoride. As temperature continues to increase, dissociation may be further facilitated as may be the reaction with fluorinated metal oxide.

Accordingly, in some embodiments of the present technology, etching methods may be performed at substrate, pedestal, and/or chamber temperatures above or about 100° C., and may be performed at temperatures above or about 150° C., above or about 200° C., above or about 250° C., above or about 300° C., above or about 350° C., above or about 400° C., above or about 450° C., or higher. The temperature may also be maintained at any temperature within these ranges, within smaller ranges encompassed by these ranges, or between any of these ranges. In some embodiments the method may be performed on substrates that may have a number of formed features, which may produce a thermal budget. Additionally, the first etchant operation, such as including a fluorine-containing precursor, may be performed at a temperature less than a temperature of the second etchant operation. For example, during delivery of the fluorine materials, a substrate temperature may be maintained at less than or about 300° C., and may be maintained at less than or about 250° C., less than or about 200° C., less than or about 150° C., less than or about 100° C., or less, which may limit reactive etching of other materials on the substrate, while allowing a fluorination to occur in the amorphized region of the metal oxide. The temperature may then be raised to any of the temperature ranges noted above for the second operation, such as greater than or about 300° C., or the substrate may be transferred to a second chamber maintained at a higher temperature for the chlorination operation.

The pressure within the chamber may also affect the operations performed as well as affect at what temperature the halogen may dissociate from the transition metal for the second removal operation. To facilitate the fluorination, which may be based on plasma-enhanced precursors, a processing pressure may be lower than in the second removal operation, which may be thermally based in some embodiments. By maintaining a lower pressure in the first operation, such as during use of the first halogen precursor, increased interaction at the substrate surface may be facilitated. The lower pressure during the first portion of the method may increase the mean-free path between atoms, as discussed above, and which may increase energy and interaction at the film surface. By utilizing a higher pressure in the second portion of the method, such as during use of the second halogen precursor, etch rate may be increased, although in some embodiments the pressure may be maintained or lowered prior to the second removal operation, and to any of the pressures noted elsewhere. Accordingly, in some embodiments the pressure may be maintained below about 20 Torr during the first portion of the etch, such as during operations 405-415, and the pressure may be maintained below or about 15 Torr, below or about 10 Torr, below or about 9 Torr, below or about 8 Torr, below or about 7 Torr, below or about 6 Torr, below or about 5 Torr, below or about 4 Torr, below or about 3 Torr, below or about 2 Torr, below or about 1 Torr, below or about 0.5 Torr, or less.

The pressure may then be maintained, reduced, or increased during the second portion of the method, such as during operations 420-425. When the pressure is increased, the pressure may be maintained at a pressure of greater than or about 1 Torr, and may be maintained at greater than or about 5 Torr, greater than or about 10 Torr, greater than or about 15 Torr, greater than or about 20 Torr, greater than or about 25 Torr, greater than or about 30 Torr, greater than or about 35 Torr, greater than or about 40 Torr, greater than or about 45 Torr, greater than or about 50 Torr, greater than or about 75 Torr, greater than or about 100 Torr, or higher, which may extend up to atmospheric pressure, although vacuum conditions may facilitate operations in some embodiments. The pressure may also be maintained at any pressure within these ranges, within smaller ranges encompassed by these ranges, or between any of these ranges.

As noted previously, in some embodiments hydrogen may be delivered with the nitrogen trifluoride, or the first halogen precursor, during the first removal operation. By including hydrogen, etch rates of materials from fluorine may be reduced or suppressed during fluorination. To protect underlying materials adjacent the metal fluoride to be removed, hydrogen may be delivered at a flow rate greater than the flow rate of the first halogen-containing precursor. For example, in some embodiments in which the first halogen-containing precursor may be nitrogen trifluoride, a flow rate ratio of hydrogen to nitrogen trifluoride may be greater than or about 1.5:1, and a flow rate ratio of hydrogen to nitrogen trifluoride may be greater than or about 2.0:1, greater than or about 2.5:1, greater than or about 3.0:1, greater than or about 3.5:1, greater than or about 4.0:1, greater than or about 4.5:1, greater than or about 5.0:1, greater than or about 10.0:1, or higher. The hydrogen radicals may help passivate other exposed materials while fluorine interacts with the amorphized metal oxide material within the feature.

By utilizing materials according to embodiments of the present technology, a controlled and directional removal of metal oxide may be performed. Performing a highly directional modification operation may allow a controlled removal operation that may be selective to the amorphized material relative to other materials on the substrate. The previously discussed methods may allow the removal of metal oxide or other oxide materials relative to a number of other exposed materials. By utilizing multi-precursor etchant processes as described previously, improved etching of metal oxide may be performed, which may both increase selectivity over conventional techniques, as well as improve etching access in small pitch features.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
    modifying an exposed surface of a layer of metal-containing material on a substrate housed in a processing region of a semiconductor processing chamber to produce a modified portion of metal-containing material;
    flowing a first halogen-containing precursor and hydrogen into a remote plasma region of the semiconductor processing chamber while striking a plasma to produce plasma effluents, wherein the first halogen-containing precursor comprises nitrogen trifluoride, and wherein a flow rate of the hydrogen is at least twice a flow rate of the first halogen-containing precursor;
    contacting the modified portion of metal-containing material with the plasma effluents, wherein the contacting produces a metal fluoride material;
    flowing a second halogen-containing precursor into the processing region;
    contacting the metal fluoride material with the second halogen-containing precursor; and
    removing the metal fluoride material.

2. The etching method of claim 1, wherein the first halogen-containing precursor comprises fluorine, wherein the second halogen-containing precursor comprises boron trichloride, and wherein the metal-containing material comprises an oxide or nitride including aluminum, hafnium, zirconium, or titanium.

3. The etching method of claim 1, further comprising halting plasma formation prior to flowing the second halogen-containing precursor.

4. The etching method of claim 1, wherein contacting the modified portion of metal-containing material with the plasma effluents is performed at a first temperature.

5. The etching method of claim 4, wherein contacting the metal fluoride material with the second halogen-containing precursor is performed at a second temperature greater than the first temperature.

6. The etching method of claim 5, wherein the first temperature is less than or about 250° C. and the second temperature is greater than or about 300° C.

7. The etching method of claim 1, wherein modifying the exposed surface of the layer of metal-containing material comprises:
    forming a plasma of an oxygen-containing precursor to produce oxygen-containing plasma effluents, and
    directing the plasma effluents to the exposed surface of the layer of metal-containing material.

8. An etching method comprising:
    forming a plasma of an oxygen-containing precursor to produce oxygen-containing plasma effluents;
    directing the oxygen-containing plasma effluents to a layer of metal oxide on a substrate housed in a processing region of a semiconductor processing chamber to produce a modified portion of metal oxide;
    flowing a fluorine-containing precursor into a remote plasma region of the semiconductor processing chamber while striking a plasma in the remote plasma region to produce plasma effluents, wherein the fluorine-containing precursor comprises nitrogen trifluoride;
    contacting the modified portion of metal oxide with the plasma effluents, wherein the contacting produces a metal oxy-fluoride material, wherein a temperature within the semiconductor processing region is maintained at less than or about 250° C. while contacting the modified portion of metal oxide with the plasma effluents;
    increasing the temperature within the semiconductor processing chamber to greater than or about 300° C.;
    flowing a chlorine-containing precursor into the processing region, wherein the chlorine-containing precursor comprises boron trichloride;
    contacting the metal oxy-fluoride material with the chlorine-containing precursor; and
    removing the metal oxy-fluoride material.

9. The etching method of claim 8, wherein the modified portion of metal oxide comprises amorphous metal oxide.

* * * * *